STABILIZATION OF JUNCTION DEVICES WITH PHOSPHOROUS TRIBROMIDE

Filed March 8, 1962

2 Sheets-Sheet 1

INVENTORS W. M. GIBSON
T. C. MADDEN
BY Edward M. Fink
ATTORNEY

May 19, 1964 W. M. GIBSON ETAL 3,133,840

STABILIZATION OF JUNCTION DEVICES WITH PHOSPHOROUS TRIBROMIDE

Filed March 8, 1962 2 Sheets-Sheet 2

INVENTORS W. M. GIBSON
T. C. MADDEN
BY Edward M. Fink
ATTORNEY

United States Patent Office 3,133,840

Patented May 19, 1964

3,133,840

STABILIZATION OF JUNCTION DEVICES WITH PHOSPHOROUS TRIBROMIDE

Walter M. Gibson, Basking Ridge, and Thomas C. Madden, Madison, N.J., assignors to Bell Telephone Laboratories, Incorporated, New York, N.Y., a corporation of New York Filed Mar. 8, 1962, Ser. No. 178,321

5 Claims. (Cl. 148—189)

This invention relates to a method for the fabrication of semiconductive devices. More particularly, the present invention is directed to a technique for stabilizing the surfaces of phosphorous diffused devices.

At an early stage in the development of semiconductor technology, it was recognized that stabilization of device surfaces was required in order to avoid variations in device characteristics. Unfortunately, failure to take such precautionary measures oft times resulted in high leakage currents and/or low breakdown voltages.

Recently, a successful surface passivation technique, known as the planar technique, wherein the junction is not exposed during processing, has come into some popularity in the semiconductor art.

In brief, the planar approach involves coating a semiconductive body, for example, silicon, with an oxide layer produced by conventional oxidation techniques. Next, a "window" is etched through the oxide layer by a suitable etchant, care being taken to mask the surrounding areas by conventional techniques. Following the etching, phosphorous or other suitable dopant is diffused into the exposed silicon from a suitable compound, for example, phosphorous pentoxide.

Devices fabricated in accordance with the procedure outlined above are particularly well suited as particle detectors in which high energy resolution or short range particle measurements are made. Unfortunately, such devices are unusually sensitive to ambient variations, particularly moisture, and often suffer adverse effects which manifest themselves in the form of increased reverse leakage currents or decreased breakdown voltage.

In accordance with this invention, a technique is described for fabricating semiconductive devices having stabilized diffused phosphorous p-n junctions wherein phosphorous tribromide is employed as the diffusant in the planar approach, so resulting in a device which does not suffer from the difficulties discussed above.

Other objects and advantages of the present invention will be better understood from the following detailed description taken in conjunction with the drawing wherein:

FIGS. 1A–1E are cross-sectional views of a wafer of p-type silicon in various stages of the present invention;

Figures 1, 2, 4:
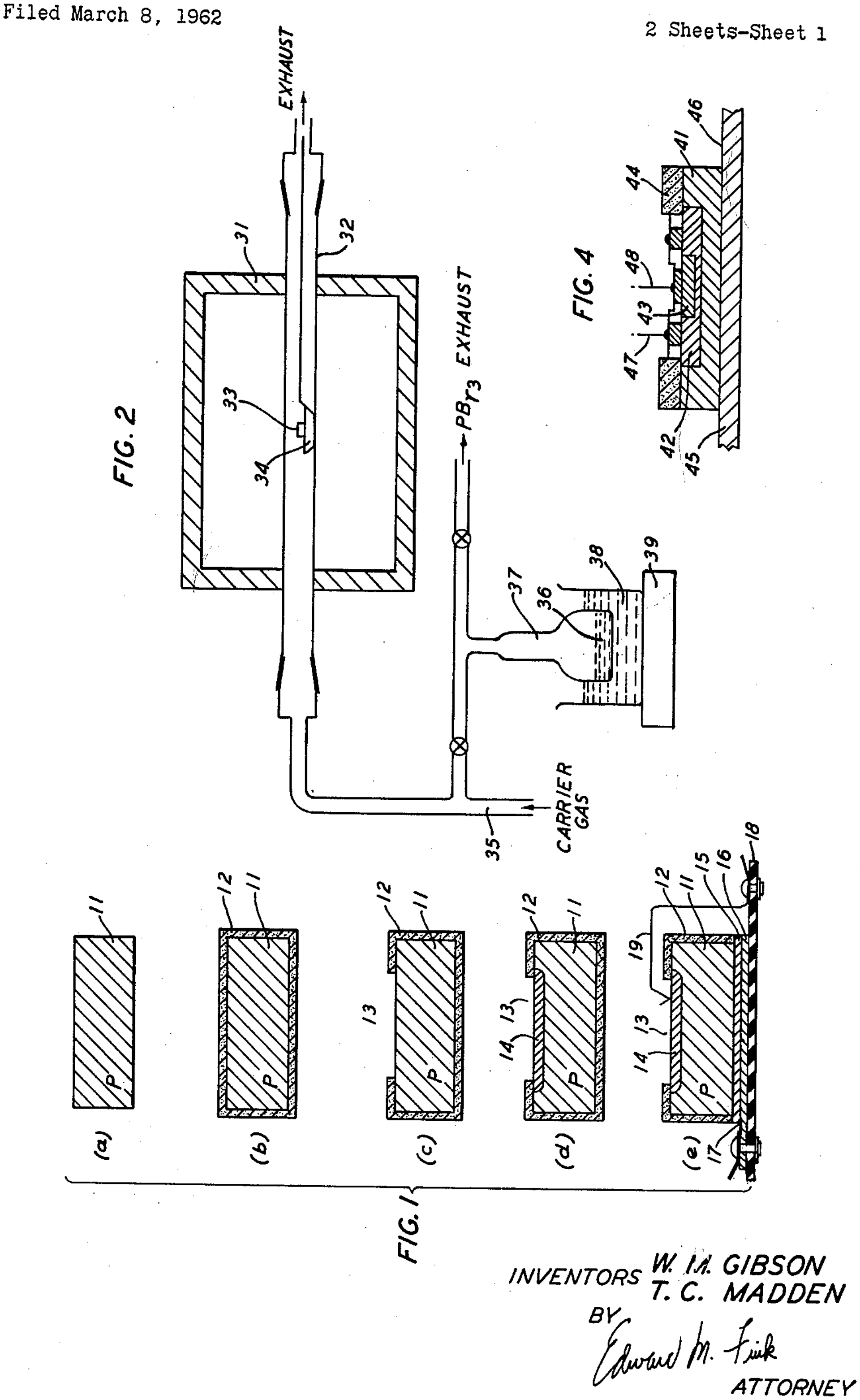
FIG. 2 is a schematic diagram of the diffusion apparatus employed in the present invention.
FIG. 4 is a cross-sectional view of a triode prepared in accordance with the present inventive technique.

Referring more particularly to FIG. 1, various stages of the present inventive technique are shown.

Initially, a silicon wafer 11 shown in FIG. 1A, typically of the order of 1 millimeter in thickness and 1.5 to 2.5 centimeters in diameter is lapped with a fine abrasive to remove saw marks, and then etched to a mirror finish in a 10:1 nitric acid-hydrofluoric acid etchant. Silicon wafer 11 is next immersed successively in concentrated nitric acid, deionized water, hydrofluoric acid and deionized water. This sequence is repeated approximately three times. Final cleaning of wafer 11 is accomplished by (*a*) boiling in concentrated nitric acid for 20 minutes, (*b*) boiling in deionized water for 10 minutes, (*c*) repeating step (*b*), and (*d*) boiling in purified water for 10 minutes. It will be appreciated that the cleaning technique outlined above is merely exemplary in nature and one of several suitable prior art cleansing techniques.

Silicon wafer 11 is next inserted into a gold-lined autoclave, having an internal spherical cavity of the order of 12.3 cubic centimeters volume. The cavity is lined with a disposable gold liner (cleaned in a manner similar to that outlined above) comprising two flanged cups stamped from high purity 0.020 inch gold sheet. The autoclave which has been preoxidized to prevent seizing of the threads and to facilitate removal of the gold liner is cleaned by boiling in an organic solvent, such as toluene, for 30 minutes, just prior to insertion of wafer 11 therein.

Following, high purity water, typically distilled water further purified in a mixed resin ion exchange column followed by distillation in a two stage quartz still, is admitted to the autoclave by means of a micropipette accurate to 0.001 milliliter. The autoclave is then sealed by closing under pressure, thereby assuring the welding together of the two gold liner halves. The autoclave is next placed in a preheated furnace and heated to a temperature of the order of 650° C., the steam pressure being within the range of 80–120 atmospheres for a suitable period of time designed to produce an oxide coating on wafer 11 of a desired thickness.

The rate of oxidation in Angstroms per minute may be calculated from Equation 1

$$\frac{dx}{dt}=\frac{1.9\times10^{3}P}{T}e^{-\frac{14,500}{T}} \qquad (1)$$

wherein P is the steam pressure in atmospheres and T is the temperature in degrees Kelvin, such equation being applicable over the temperature range of 500–900° C. and pressure range of 25–500 atmospheres.

The number of moles of water required to attain a given pressure may be determined from Equation 2

$$n=\frac{PV}{ZRT} \qquad (2)$$

wherein P is the desired steam pressure, V is the volume of the bomb cavity (minus the volume of the sample), R is the gas constant, T is the temperature in degrees Kelvin and Z is the compressibility factor taken from the table of Comings.

Shown in FIG. 1B is silicon wafer 11, having silicon dioxide layer 12, grown by steam oxidation, deposited thereon. Following the oxidation, the oxide layer 12 is removed from selected portions of wafer 11 by means of a suitable etchant, such as dilute ammonium fluoride while the remainder of oxide layer 12 is masked by conventional photoresist techniques. Next, the photoresist mask is removed by means of a suitable solvent.

FIG. 1C is a cross-sectional view of wafer 11 showing oxide layer 12 and space 13 from which the oxide has been removed by etching.

Next, phosphorous is diffused into the exposed silicon by heating the wafer to a temperature within the range of 800–1000° C. and exposing it to a carrier gas containing vapors of phosphorous tribromide.

The silicon wafer 11 is inserted into the center of a suitable diffusion furnace, a nitrogen gas flow established and the furnace heated to the diffusion temperature. Next, reagent grade phosphorous tribromide is heated to at least 160° C. and the vapors introduced into the carrier gas. The minimum temperature of heating of the tribromide is dictated by the difficulty in obtaining suitable concentrations of phosphorous. The tribromide has a boiling point of 173° C., thereby determining the maximum temperature of heating. After diffusion to a depth of approximately $0.1\mu$, the phosphorous tribromide vapors are routed to traps and the furnace cooled. The resultant assembly is shown in cross-sectional view in FIG. 1D having phosphorous diffused layer 14.

The resultant assembly may then be employed in suitable device applications, for example, as a particle detector by removing the continuous oxide layer from the undiffused side of the wafer by sand-blasting and rubbing lead 15, shown in FIG. 1E, into the resultant damaged surface until a low sheet resistance is attained. The assembly is then affixed to a copper disk 16, which is used as one contact, with an indium-mercury amalgam 17 and disk 16 mounted on mica sheet 18. A spring wire contact 19 is made to each of the diffused areas, so completing the device.

FIG. 2 is a schematic representation of the apparatus employed in conducting the diffusion step outlined above. Shown in the figure is furnace 31, having inserted therein quartz tube 32. The silicon wafer 33 is contained within quartz boat 34. During the operation of the process carrier gas is admitted to the system, via conduit 35, together with vapors of phosphorous tribromide. The tribromide 36 contained within beaker 37 is seated in silicone oil 38 and heated by means of hot plate 39.

As noted above, adverse effects have been noted in prior art diffused silicon semiconductive devices when subjected to various ambients. It has been theorized that amorphous silica tends to undergo structural transformations under conditions prevalent during high temperature diffusion techniques. It is believed that these phase transformations are generally catalyzed by materials such as phosphorous pentoxide and boron oxide and often involve a disruption of the structure and reformation of chemical bonds, so resulting in microfissures which permit ambient gases to reach the surface of the silicon. In order to obtain a direct comparison between the semiconductive devices fabricated by the technique disclosed herein and those of the prior art, the following procedure was followed:

Two wafers were cut from adjacent positions on an ingot of 2500 ohm-cm. of p-type silicon. Both samples were prepared by lapping, etching, and cleansing in accordance with the procedure outlined above. The clean samples were placed in a gold-lined autoclave and high purity water was added thereto by means of a micropipette, accurate to 0.001 milliliter. The autoclave was then sealed and heated to a temperature and maintained at a pressure sufficient to grow an oxide film of 4000 A., such conditions being determined by reference to Equations 1 and 2 above.

The next stage in the processing of the two wafers consisted of removing three (5 millimeters in diameter) circular areas on one side of each sample by use of an etchant comprising dilute ammonium fluoride. During the etching step, a photoresist mask was applied to the area not desired to be etched, such photoresist being removed by conventional techniques subsequent to etching.

Following etching, one wafer was subjected to phosphorous diffusion with phosphorous pentoxide, a conventional prior art technique, and the other wafer to phosphorous diffusion with phosphorous tribromide.

The technique involved in the pentoxide diffusion involved insertion of the wafer into a quartz boat which was suitably positioned in a quartz tube located in a diffusion furnace. A second quartz boat containing reagent grade phosphorous pentoxide powder was suitably positioned in the quartz tube in an area surrounded by a heating tape. With nitrogen gas flowing through the system, the phosphorous pentoxide was heated by means of the heating tape to a temperature of approximately 245° C. at which time dense fumes began to flow. Next, the nitrogen carrier gas flow was reversed, so permitting the pentoxide fumes to flow over the wafer. During the processing the diffusion furnace was maintained at approximately 950° C. After three minutes at the indicated temperature, a diffusion depth of approximately $0.1\mu$ was attained.

The diffusion technique for the phosphorous tribromide utilized apparatus similar to that shown in FIG. 2. Wafer 33, prepared as described, was inserted in quartz boat 34 which was suitably positioned in tube 32 within furnace 31. Nitrogen carrier gas was admitted to the system via conduit 35. Phosphorous tribromide 36 contained within beaker 37, which was seated in silicone oil 38 was heated by means of hot plate 39 to a temperature of 170° C. Diffusion furnace 31 was heated to a temperature of 950° C. and the nitrogen carrier gas together with vapors of the tribromide were permitted to flow over wafer 33 for 3 minutes at which time a diffusion depth of approximately $0.1\mu$ was obtained.

Electrical leads were attached to each of the two wafers and reverse leakage currents of each device were measured simultaneously using a Keithley micro-microammeter while subjecting them to the same ambient variations.

Figure 3:
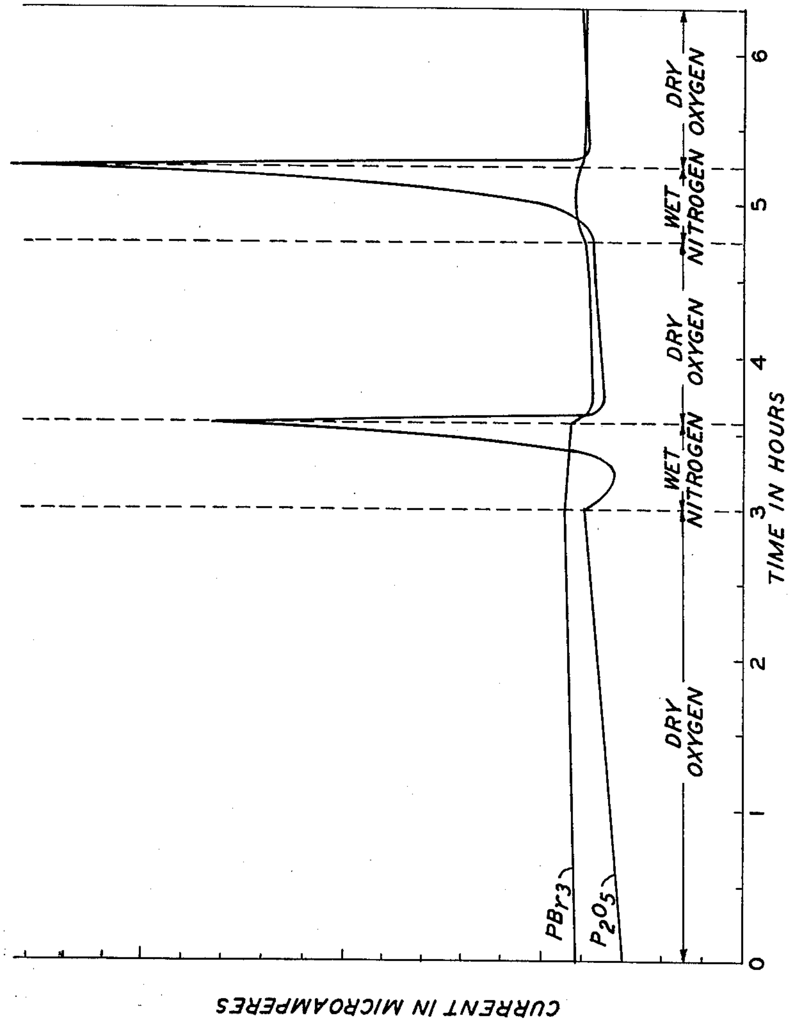
FIG. 3 is a graphical representation on cordinates of microamperes against time in hours showing variations in reverse leakage currents of phosphorous tribromide and phosphorous pentoxide diffused devices in wet and dry ambients.

FIG. 3 is a graphical representation on coordinates of current in microamperes against time in hours showing the response of both devices to dry oxygen and wet nitrogen (80% humidity) ambients with 100 volts reverse bias applied continuously. As noted from the figure, the tribromide diffused device showed little change in reverse leakage current due to variation in ambients (from dry to wet) whereas the pentoxide diffused device shows the characteristic increase in leakage current in an ambient having a high moisture content.

FIG. 4 is a cross-sectional view of a diffused phosphorous transistor produced in accordance with the technique described herein. Shown in the figure is a wafer of n-type silicon 41 having a first diffused region 42 comprising boron and a second diffused region 43 comprising phosphorous diffused therein as outlined above and silicon dioxide layer 44. Silicon body 41 is converted to header 45 by means of soldering thereby providing collector lead 46. Base lead 47 and emitter lead 48 complete the assembly.

While the invention has been described in detail in the foregoing description and the drawing similarly illustrates the same, the aforesaid is by way of illustration only and is not restrictive in character. The several modifications which will readily suggest themselves to persons skilled in the art are all considered within the broad scope of the invention, reference being had to the appended claims.

What is claimed is:

1. In the process for the fabrication of a semiconductive device which comprises the steps of forming an oxide coating on a semiconductive body, selectively etching said semiconductive body whereby portions of said oxide coating are removed and diffusing phosphorous into said semiconductive body, the improvement which comprises employing phosphorous tribromide as diffusant.

2. A device produced in accordance with the procedure of claim 1.

3. The process according to the procedure of claim 1 wherein said semiconductive body is a wafer of p-type silicon.

4. The process according to the procedure of claim 3 wherein said phosphorous diffusion is conducted by heating said semiconductive body to a temperature within the range of 800–1000° C. for a time period of the order of 3 minutes.

5. The process according to the procedure of claim 4 wherein said diffusant is heated to a temperature within the range of 160–173° C. thereby forming vapors which are introduced into a nitrogen carrier gas flowing over said semiconductive body.

References Cited in the file of this patent

UNITED STATES PATENTS 2,802,760 Derick et al. ____________ Aug. 13, 1957